United States Patent
Forster et al.

(10) Patent No.: US 6,190,513 B1
(45) Date of Patent: *Feb. 20, 2001

(54) DARKSPACE SHIELD FOR IMPROVED RF TRANSMISSION IN INDUCTIVELY COUPLED PLASMA SOURCES FOR SPUTTER DEPOSITION

(75) Inventors: John C. Forster, San Francisco; Bradley O. Stimson, San Jose; Zheng Xu, Foster City, all of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/856,421

(22) Filed: May 14, 1997

(51) Int. Cl.⁷ .................................................. C23C 14/34
(52) U.S. Cl. ............................ 204/192.12; 204/298.08; 204/298.11
(58) Field of Search ................... 204/192.12, 298.08, 204/298.11; 156/345 L; 118/723 E (56) References Cited

U.S. PATENT DOCUMENTS

| | | | |
|---|---|---|---|
| 3,619,402 | 11/1971 | Wurm et al. | 204/298 |
| 4,336,118 | 6/1982 | Patten et al. | 204/192 EC |
| 4,362,632 | 12/1982 | Jacob | 422/183.04 |
| 4,626,312 | 12/1986 | Tracy | 156/345 |
| 4,661,228 | 4/1987 | Mintz | 204/192.25 |
| 4,716,491 | 12/1987 | Ohno et al. | 361/230 |
| 4,792,732 | 12/1988 | O'Loughlin | 315/334 |
| 4,842,703 | 6/1989 | Class et al. | 204/192.12 |
| 4,844,775 | 7/1989 | Keeble | 156/643 |
| 4,865,712 | 9/1989 | Mintz | 204/298 |
| 4,871,421 | 10/1989 | Ogle et al. | 156/643 |
| 4,918,031 | 4/1990 | Flamm et al. | 437/225 |
| 4,925,542 | 5/1990 | Kidd | 204/192.31 |
| 4,941,915 | 7/1990 | Matsuoka et al. | 204/298.12 |
| 4,948,458 | 8/1990 | Ogle | 156/643 |
| 4,990,229 | 2/1991 | Campbell et al. | 204/298.06 |
| 4,999,096 | 3/1991 | Nihei et al. | 204/192.3 |
| 5,065,698 | 11/1991 | Koike | 118/719 |
| 5,091,049 | 2/1992 | Campbell et al. | 156/643 |
| 5,122,251 | 6/1992 | Campbell et al. | 204/298.06 |
| 5,126,028 | * 6/1992 | Hurwitt et al. | 204/192.13 |
| 5,135,629 | 8/1992 | Sawada et al. | 204/192.12 |
| 5,146,137 | 9/1992 | Gesche et al. | 315/111.21 |
| 5,175,608 | 12/1992 | Nihei et al. | 257/751 |

(List continued on next page.)

FOREIGN PATENT DOCUMENTS

| | | | |
|---|---|---|---|
| 0520519 | 12/1992 | (EP) | H01J/37/32 |
| 0593924 | 9/1993 | (EP) | H01J/37/42 |

(List continued on next page.)

OTHER PUBLICATIONS

Search report dated Oct. 13, 1999 from EP 97307895.9.
U.S. application No. 08/730,722, filed Oct. 8, 1996 (Aty. Dk. 1207/MD/PVD/DV).

(List continued on next page.)

*Primary Examiner*—Nam Nguyen
*Assistant Examiner*—Steven H. Versteeg
(74) *Attorney, Agent, or Firm*—Konrad Raynes & Victor LLP (57) ABSTRACT

A deposition system in a semiconductor fabrication system provides a slotted grounded darkspace shield, which protects the target sidewalls. It has been found that an axial slot in the grounded darkspace shield can prevent eddy currents from flowing in the darkspace shield and thereby prevent RF power losses due to eddy currents that would otherwise flow in an unslotted darkspace shield due to RF power applied to an RF coil-shield. By preventing the RF power losses, the RF coupling efficiency of RF power applied to the RF coil-shield can also be improved.

28 Claims, 5 Drawing Sheets

U.S. PATENT DOCUMENTS

| | | | |
|---|---|---|---|
| 5,178,739 | 1/1993 | Barnes et al. | 204/192.12 |
| 5,206,516 | 4/1993 | Keller et al. | 250/492.2 |
| 5,225,740 | 7/1993 | Ohkawa | 315/111.41 |
| 5,231,334 | 7/1993 | Paranjpe | 315/711.21 |
| 5,234,529 | 8/1993 | Johnson | 156/345 |
| 5,234,560 | 8/1993 | Kadlec et al. | 204/192.12 |
| 5,241,245 | 8/1993 | Barnes et al. | 315/111.41 |
| 5,280,154 | 1/1994 | Cuomo et al. | 219/121.52 |
| 5,304,279 | 4/1994 | Coultas et al. | 156/345 |
| 5,312,717 | 5/1994 | Sachdev et al. | 430/313 |
| 5,334,298 | 8/1994 | Gegenwart | 204/192.12 |
| 5,346,578 | 9/1994 | Benzing et al. | 156/345 |
| 5,361,016 | 11/1994 | Ohkawa et al. | 315/111.41 |
| 5,366,585 | 11/1994 | Robertson et al. | 156/643 |
| 5,366,590 | 11/1994 | Kadomura | 156/662 |
| 5,368,685 | 11/1994 | Kumihashi et al. | 156/643 |
| 5,397,962 | 3/1995 | Moslehi | 315/111.51 |
| 5,401,350 | 3/1995 | Patrick et al. | 156/345 |
| 5,404,079 | 4/1995 | Ohkuni et al. | 315/111.81 |
| 5,417,834 | 5/1995 | Latz | 204/298.11 |
| 5,418,431 | 5/1995 | Williamson et al. | 315/111.51 |
| 5,421,891 | 6/1995 | Campbell et al. | 118/723 R |
| 5,429,070 | 7/1995 | Campbell et al. | 118/723 R |
| 5,429,710 | 7/1995 | Akiba et al. | 216/17 |
| 5,429,995 | 7/1995 | Nishiyama et al. | 437/238 |
| 5,430,355 | 7/1995 | Paranjpe | 315/111.21 |
| 5,433,812 | 7/1995 | Cuomo et al. | 150/345 |
| 5,470,451 | 11/1995 | Kobayashi et al. | 204/298.03 |
| 5,471,115 | 11/1995 | Hikosaka | 315/111.21 |
| 5,503,676 | 4/1996 | Shufflebotham et al. | 118/723 MR |
| 5,534,231 | 7/1996 | Savas | 216/67 |
| 5,540,800 | 7/1996 | Qian | 156/345 |
| 5,540,824 | 7/1996 | Yin et al. | 204/298.34 |
| 5,560,776 | 10/1996 | Sugai et al. | 718/723 AN |
| 5,569,363 | 10/1996 | Bayer | 204/192.32 |
| 5,573,595 | 11/1996 | Dible | 118/723 MP |
| 5,665,167 | 9/1997 | Deguchi et al. | 118/728 |
| 5,690,795 | 11/1997 | Rosenstein et al. | 204/192.1 |
| 5,763,851 | 6/1998 | Forster et al. | 219/121.43 |
| 5,800,688 | 9/1998 | Lantsman et al. | 204/298.11 |

FOREIGN PATENT DOCUMENTS

| | | | |
|---|---|---|---|
| 0607797 | 1/1994 | (EP) | H01J/37/32 |
| 0593924 | 4/1994 | (EP) | H01J/37/32 |
| 0774886 | 5/1997 | (EP) | H05H/1/46 |
| 0782172 | 7/1997 | (EP) | H01J/37/32 |
| 2162365 | 1/1986 | (GB) | H01J/27/02 |
| 2231197 | 11/1990 | (GB) | H01J/37/32 |
| 58-171822 | 10/1983 | (JP) | H01L/21/332 |
| 59-190363 | 10/1984 | (JP) | C23C/15/00 |
| 61-190070 | 8/1986 | (JP) | C23L/14/34 |
| 2-141575 | 5/1990 | (JP) | C23C/14/34 |
| 6-232055 | 8/1994 | (JP) | H01L/21/205 |
| 6244151 | 9/1994 | (JP) | H01L/21/332 |
| 6-283470 | 10/1994 | (JP) | H01L/21/302 |
| 7-176398 | 7/1995 | (JP) | H05H/1/46 |
| 7-176399 | 7/1995 | (JP) | H05H/1/46 |
| 8-153712 | 6/1996 | (JP) | H01L/21/306 |
| 8-288259 | 11/1996 | (JP) | H01L/21/306 |
| WO860623 | 11/1986 | (WO) | H05H/1/46 |
| 9214258 | 8/1992 | (WO) | H01J/37/32 |
| WO 96 16051 | 5/1996 | (WO) | H01J/37/32 |
| 9613051 | 10/1996 | (WO) | C23L/14/34 |

OTHER PUBLICATIONS

U.S. application No. 08/856,423, filed May 14, 1997 (Aty. Dk. 1621/PVD/DV).

U.S. application No. 09/049,839, filed Mar. 27, 1998 (Aty. Dk. 938.D1/PVD/DV).

U.S. application No. 08/853,024 filed Apr. 17, 1996 (Aty. Dk. 1186.P1/PVD/DV).

Singapore Search Report issued Feb. 4, 1999 in App. 9703673–5, filed Oct. 6, 1997.

Search Report in European patent application No. 97307895.9.

M. Yamashita, "Sputter Type High Frequency Ion Source for Ion Beam Deposition Apparatus," *Jap. J. Appl. Phys.*, vol. 26, pp. 721–727, 1987.

M. Yamashita, "Fundamental Characteristics of Built–in High Frequency Coil Type Sputtering Apparatus," *J. Vac. Sci. Technol.*, vol. A7, pp. 151–158, 1989.

S.M. Rossnagel et al., "Metal Ion Deposition from Ionized Magnetron Sputtering Discharge," *J. Vac. Sci. Technol.*, vol. B12, pp. 449–453, 1994.

S.M. Rossnagel et al., "Magnetron Sputter Deposition with High Levels of Metal Ionization," *Appl. Phys. Lett.*, vol. 63, pp. 3285–3287, 1993.

S.M. Rossnagel, et al., "Filling Dual Damascene Interconnect Structures with AlCu and Cu Using Ionized Magnetron Deposition," *J. Vac. Sci. Technol.*, vol. B13, pp. 125–129, 1995.

Y–W. Kim et al., "Directed Sputter Deposition of AlCu: Film Microstructure and Chemistry," *J. Vac. Sci. Technol.*, vol. A12, pp. 3169–3175, 1994.

J. Hopwood et al., "Mechanisms for Highly Ionized Magnetron Sputtering," *J. Appl. Phys.*, vol. 78, pp. 758–765, 1995.

P. Kidd, "A Magnetically Confined and ECR Heated Plasma Machine for Coating and Ion Surface Modification Use," *J. Vac. Sci. Technol.*, vol. A9, pp. 466–473, 1991.

W.M. Holber, et al., "Copper Deposition by Electron Cyclotron Resonance Plasma," *J. Vac. Sci. Technol.*, vol. A11, pp. 2903–2910, 1993.

M. Matsuoka et al., Dense Plasma Production and Film Deposition by New High–Rate Sputtering Using an Electric Mirror, *J. Vac. Sci. Technol.*, A 7 (4), 2652–2657, Jul./Aug. 1989.

N. Jiwari et al., "Helicon wave plasma reactor employing reactor single–loop antenna," *J. of Vac. Sci. Technol.*, A 12(4), pp. 1322–1327, Jul./Aug. 1994.

Search report dated Feb. 27, 1997, EPC application No. 96308251.6.

U.S. application No. 08/461,575, filed Sep. 30, 1992 (Atty. Dk. 364.F1).

U.S. application No. 08/733,620, filed Oct. 17, 1996 (Attorney Docket# 1457/PVD/DV).

* cited by examiner

DARKSPACE SHIELD FOR IMPROVED RF TRANSMISSION IN INDUCTIVELY COUPLED PLASMA SOURCES FOR SPUTTER DEPOSITION

FIELD OF THE INVENTION

The present invention relates to plasma generators, and more particularly, to a method and apparatus for generating a plasma to sputter deposit a layer of material in the fabrication of semiconductor devices.

BACKGROUND OF THE INVENTION

Low density plasmas have become convenient sources of energetic ions and activated atoms which can be employed in a variety of semiconductor device fabrication processes including surface treatments, depositions, and etching processes. For example, to deposit materials onto a semiconductor wafer using a sputter deposition process, a plasma is produced in the vicinity of a sputter target material which is negatively biased. Ions created adjacent to the target impact the surface of the target to dislodge, i.e., "sputter" material from the target. The sputtered materials are then transported and deposited on the surface of the semiconductor wafer.

Sputtered material has a tendency to travel in straight line paths from the target to the substrate being deposited, at angles which are oblique to the surface of the substrate. As a consequence, materials deposited in etched trenches and holes of semiconductor devices having trenches or holes with a high depth to width aspect ratio, can bridge over causing undesirable cavities in the deposition layer. To prevent such cavities, the sputtered material can be redirected into substantially vertical paths between the target and the substrate by negatively charging the substrate to position vertically oriented electric fields adjacent the substrate if the sputtered material is sufficiently ionized by the plasma. However, material sputtered in a low density plasma often has an ionization degree of less than 1% which is usually insufficient to avoid the formation of an excessive number of cavities. Accordingly, it is desirable to increase the density of the plasma to increase the ionization rate of the sputtered material in order to decrease the formation of unwanted cavities in the deposition layer. As used herein, the term "dense plasma" is intended to refer to one that has a high electron and ion density.

There are several known techniques for exciting a plasma with RF fields including capacitive coupling, inductive coupling and wave heating. In a standard inductively coupled plasma (ICP) generator, RF current passing through a coil surrounding the plasma induces electromagnetic currents in the plasma. These currents heat the conducting plasma by ohmic heating, so that it is sustained in steady state. As shown in U.S. Pat. No. 4,362,632, for example, current through a coil is supplied by an RF generator coupled to the coil through an impedance matching network, such that the coil acts as the first windings of a transformer. The plasma acts as a single turn second winding of a transformer.

It has been found that material sputtered from the edges of the target can contribute to non-uniform depositions. In order to promote uniform deposition, it is often preferred to place what is referred to as a "darkspace" shield adjacent the edge of the target. The darkspace shield reduces sputtering of the target edges by shielding the target edges from the plasma.

In a number of deposition chambers such as a physical vapor deposition chamber, the chamber walls are often formed of a conductive metal such as stainless steel. Because of the conductivity of the chamber walls, it is often preferred to place the antenna coils or electrodes within the chamber itself because the conducting chamber walls would block or substantially attenuate the electromagnetic energy radiating from the antenna. As a result, the coil and its supporting structures are directly exposed to the deposition flux and energetic plasma particles. This is a potential source of contamination of the film deposited on the wafer, and is undesirable.

To protect the coils, shields made from nonconducting materials, such as ceramics, can be placed in front of the coil. However, many deposition processes involve deposition of conductive materials such as aluminum on the electronic device being fabricated. Because the conductive material will coat the ceramic shield, it will soon become conducting, thus again substantially attenuating penetration of electromagnetic radiation into the plasma. Consequently, it is often preferred to place a shield wall behind the coil to protect the interior of the deposition chamber from the deposition material. However, the problem of particulate matter often remains for sputtering chambers of this design.

In copending application Ser. No. 08/559,345, pending entitled "Method and Apparatus for Generating a Plasma" filed Nov. 15, 1995 (Attorney Docket #938/PVD/DV) a Continuing Prosecution Application having been filed on Jan. 29, 1999 (Attorney Docket #938.P1/PVD/DV) and application Ser. No. 08/730,722, pending entitled "Active Shield for Generating a Plasma for Sputtering," filed Oct. 8, 1996 (Attorney Docket #1207/PVD/DV), incorporated by reference in their entireties, active shield designs have been disclosed in which a modified conductive shield is coupled to an RF source such that the shield itself functions as a coil to couple RF energy into the plasma. The present invention is directed to a further improvement of such active shield designs to increase the efficiency of energy transmission.

SUMMARY OF THE PREFERRED EMBODIMENTS

It is an object of the present invention to provide an improved method and apparatus for generating a plasma within a chamber and for sputter-depositing a layer which obviate, for practical purposes, the above-mentioned limitations.

These and other objects and advantages are achieved by, in accordance with one aspect of the invention, a plasma generating apparatus which comprises an active shield which inductively couples electromagnetic energy into a plasma, and a darkspace shield for shielding the target sidewalls, in which the darkspace shield has a slot or other discontinuity to prevent eddy currents from flowing in the darkspace shield. Such an arrangement has been found to prevent or reduce RF power losses due to eddy currents that would otherwise flow in an unslotted darkspace shield. By reducing the RF power losses, the RF coupling efficiency can also be improved.

In a preferred embodiment, an apparatus for energizing a plasma within a semiconductor fabrication system to sputter material onto a workpiece may include a semiconductor fabrication chamber having a slotted darkspace shield and a plasma generation region adjacent the slotted darkspace shield. A coil-shield carried by the chamber is positioned to couple energy into the plasma generation region, while the slotted darkspace shield prevents eddy currents from flowing in the darkspace shield in response to energy coupled into the plasma generation region. As a consequence, the RF energy is more efficiently coupled into the plasma generation region by the coil-shield. The target and coil-shield may both include titanium, aluminum or other suitable materials.

DETAILED DESCRIPTION OF THE DRAWINGS

Figure 1:
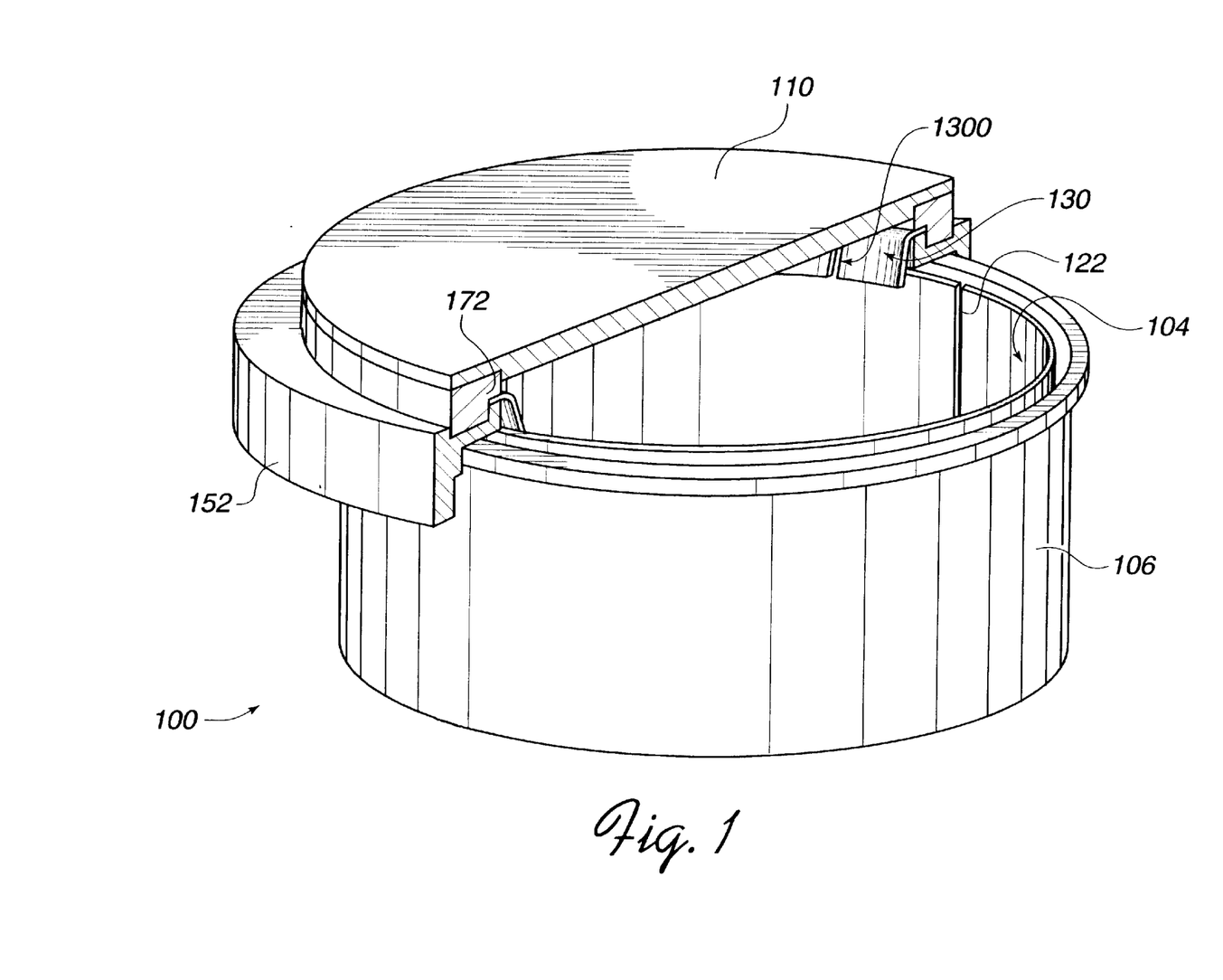
FIG. 1 is a perspective, partial cross-sectional view of a plasma generating chamber in accordance with one embodiment of the present invention.
Figure 2:
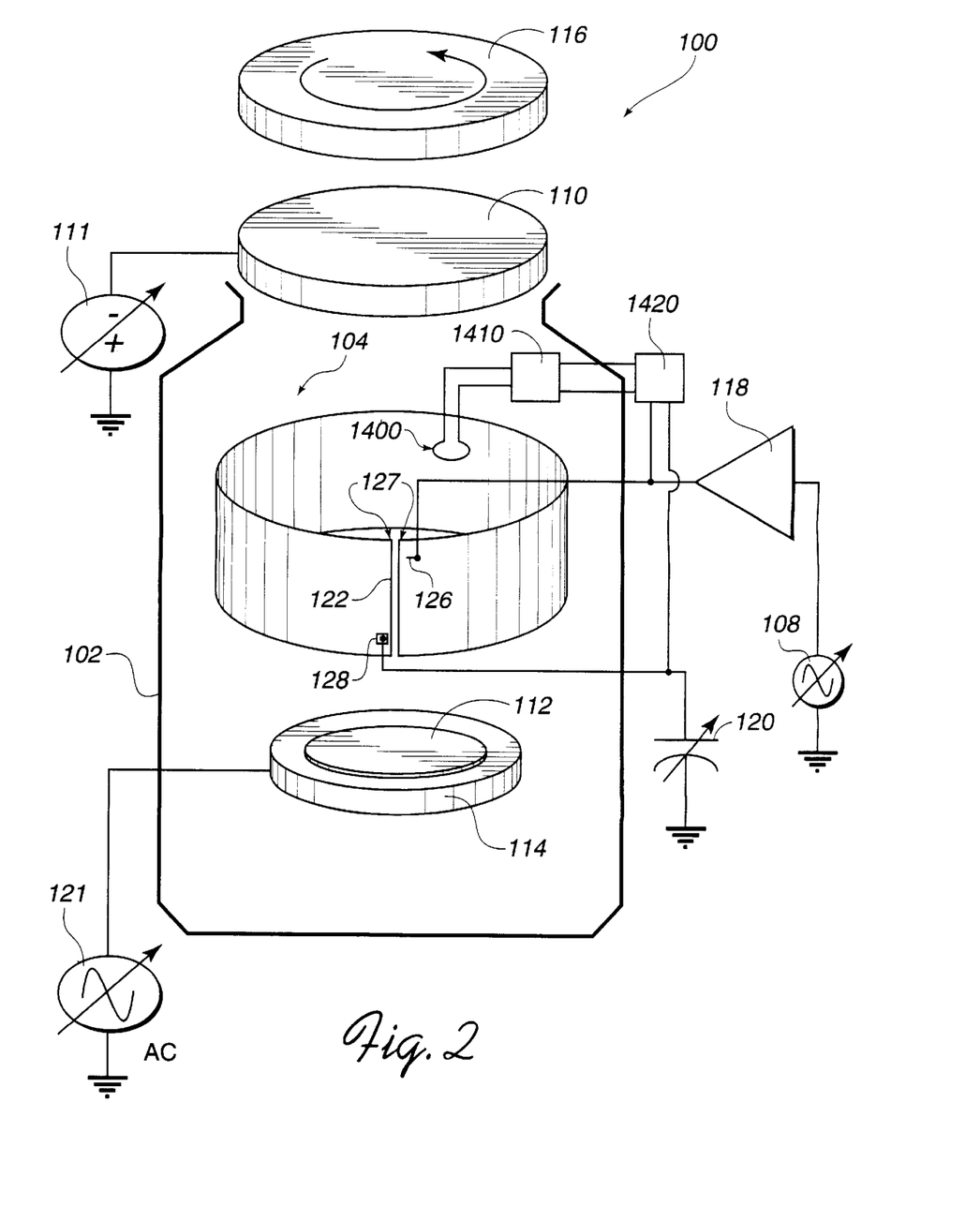
FIG. 2 is a schematic diagram of the electrical interconnections to the plasma generating chamber of FIG. 1.
Figure 3:
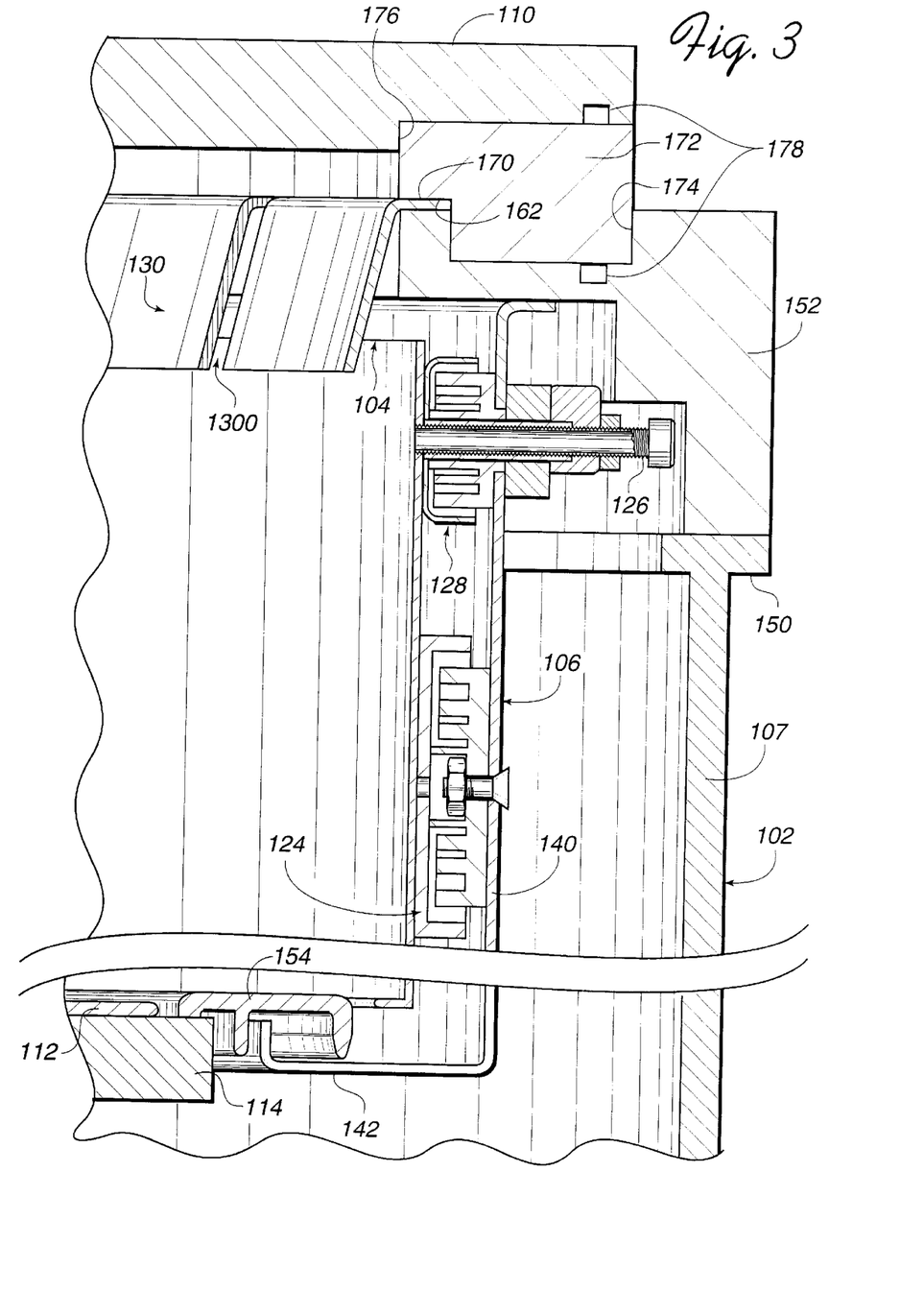
FIG. 3 is a schematic partial cross-sectional view of the plasma generating chamber of FIG. 1 shown installed in a vacuum chamber.

Referring first to FIGS. 1–3, a plasma generator in accordance with an embodiment of the present invention comprises a substantially cylindrical deposition system 100 which is received in a vacuum chamber 102 (shown schematically in FIG. 2). The deposition system 100 of this embodiment has an inner shield 104 which is formed into a single turn coil and is insulatively carried internally by an outer shield 106. The shields 104 and 106 protect the interior walls 107 (FIG. 3) of the vacuum chamber 102 from the material being deposited within the interior of the deposition system 100.

An ion flux strikes a negatively biased target 110 positioned at the top of the vacuum chamber 102. The target 110 is negatively biased by a DC power source 111. The ions eject material from the target 110 onto a substrate 112 which may be a wafer or other workpiece which is supported by a pedestal 114 at the bottom of the deposition system 100. A rotating magnetron magnet assembly 116 provided above the target 110 produces magnetic fields which sweep over the face of the target 110 to promote uniform erosion of the target. A generally annular shaped darkspace shield 130 positioned adjacent to the periphery of the target 110 is usually grounded and protects the edge portion of the target 110 from the ion flux striking the target. It has been found that by reducing sputtering from the edges of the target, uniformity of deposition on the workpiece may be enhanced.

Radio frequency (RF) energy from an RF generator 108 is radiated from the coil-shield 104 into the interior of the deposition system 100, which energizes a plasma within the deposition system 100. The atoms of material ejected from the target 110 are in turn ionized by the plasma being energized by the coil-shield 104 which is inductively coupled to the plasma. In one feature of the present invention, it has been found that an axial slot 1300 in the darkspace shield 130 can reduce or prevent eddy currents from flowing in the slotted darkspace shield 130 and thereby reduce RF power losses due to eddy currents that would otherwise flow in an unslotted darkspace shield.

The RF generator 108 is preferably coupled to the coil-shield 104 through an amplifier and impedance matching network 118. The other end of the coil-shield 104 is coupled to ground, preferably through a capacitor 120 which may be a variable capacitor. The ionized deposition material is attracted to the substrate 112 and forms a deposition layer thereon. The pedestal 114 may be negatively biased by an AC (or DC or RF) source 121 so as to externally bias the substrate 112. As set forth in greater detail in copending application Ser. No. 08/677,588, filed Jul. 9, 1996, now abandoned, (Attorney Docket #1402/PVD/DV), entitled "Method for Providing Full-face High Density Plasma Deposition," by Ken Ngan, Simon Hui and Gongda Yao, which is assigned to the assignee of the present application and is incorporated herein by reference in its entirety, external biasing of the substrate 112 may optionally be eliminated.

Figure 4:
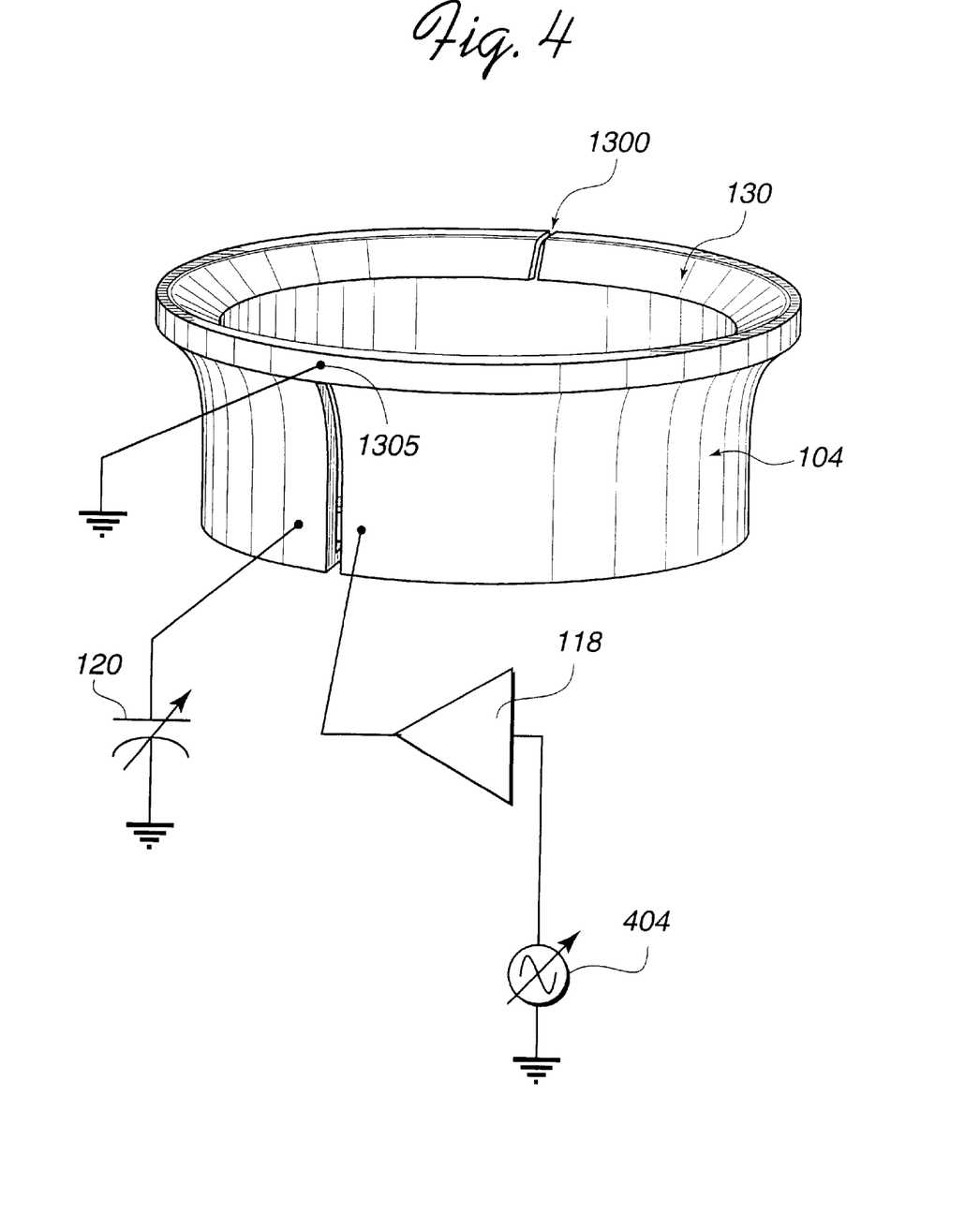
FIG. 4 is a schematic perspective view of an embodiment of a slotted darkspace shield and a powered coil-shield.

As best seen in FIGS. 1 and 3, the slotted darkspace shield 130 provides a ground plane with respect to the target 110 above, the target 110 being negatively biased. FIG. 4 shows the shield 130 grounded at a single ground point 1305 opposite the slot 1300.

In addition, as explained in greater detail in copending application Serial No. 08/647,182, abandoned "Recessed Coil for Generating a Plasma," the darkspace shield 130 also shields the outer edges of the target 110 from the plasma to reduce sputtering of the target 110 outer edges. The darkspace shield 130 performs yet another function in that it is positioned to shield the coil-shield 104 from the material being sputtered from the target 110. The darkspace shield 130 does not completely shield the coil-shield 104 from all of the material being sputtered since some of the sputtered material travels at an oblique angle with respect to the vertical axis of the plasma chamber 100. However, because much of the sputtered material does travel parallel to the vertical axis of the chamber or at relatively small oblique angles relative to the vertical axis, the darkspace shield 130 which is positioned in an overlapping fashion above the coil-shield 104, prevents a substantial amount of sputtered material from being deposited on the coil-shield 104. By reducing the amount of material that would otherwise be deposited on the coil-shield 104, the generation of particles by the material which is deposited on the coil-shield 104 can be substantially reduced.

In the illustrated embodiment, the darkspace shield 130 is a generally discontinuous ring of titanium (where titanium deposition is occurring in the deposition system 100 ), aluminum (for aluminum deposition) or stainless steel, having a generally inverted frusto-conical shape. The slotted darkspace shield 130 extends inward toward the center of plasma chamber 100 so as to overlap the coil-shield 104 by a distance of approximately ¼ inch (6 mm), with the bottom of the slotted darkspace shield 130 spaced apart from the wall of the coil-shield 104 by about ¼ inch (6 mm), as best seen in FIG. 3. It is recognized, of course, that the amount of overlap can be varied depending upon the relative size and placement of the coil-shield 104 and other factors. For example, the overlap may be increased to increase the shielding of the coil-shield 104 from the sputtered material but increasing the overlap could also further shield the target 110 from the plasma which may be undesirable in some applications.

In accordance with one aspect of the present invention, the slot 1300 of the darkspace shield 130 improves the RF coupling efficiency between the RF powered coil-shield 104 and the plasma. It has been found that the overlap between an unslotted darkspace shield and the RF powered coil-shield 104 can result in RF power losses due to azimuthal eddy currents flowing in the unslotted darkspace shield. The slot 1300 reduces or eliminates such azimuthal eddy currents from flowing in the slotted darkspace shield 130.

It has been found that the improvement of RF coupling efficiency may be measured using a pick-up loop 1400, shown schematically in FIG. 2, inserted into the plasma chamber 100 to detect RF electromagnetic fields therein. A network analyzer 1410 is used to detect the RF electromagnetic fields with the pick-up loop 1400 synchronously with the RF power applied to the coil-shield 104. The network analyzer 1410 is connected both to the pick-up loop 1400 and to a matching network 1420, which is connected to the coil-shield 104, as shown schematically in FIG. 2. The transmission ratio $S_{12}$ of the RF power detected by the pick-up loop 1400 to the RF power input to the coil-shield 104 is given theoretically by:

$$S_{21} = \frac{\omega^2 k^2 L_{coil} L_{pick\text{-}up}}{R_{analyzer}^2 + R_{pick\text{-}up}^2} \cdot \frac{R_{analyzer}}{R_{coil}}$$

where ω is the angular frequency of the RF generator 404 (2π times the frequency ν of the RF generator 404 ), $L_{coil}$ is the inductance of the coil-shield 104, $L_{pick\text{-}up}$ is the inductance of the pick-up loop 1400, k is the coupling coefficient between the coil-shield 104 and the pick-up loop 1400, $R_{coil}$ is the resistance of the coil-shield 104, and $R_{analyzer}$ is the resistance of the network analyzer 1410 (for example, 50Ω). It has been found that an unslotted darkspace shield gives a transmission ratio $S_{12}$ of −69.5 dB (which corresponds to a value of 1.12×10⁻⁷). By contrast, it has also been found that a slotted darkspace shield 130 gives a transmission ratio $S_{12}$ of −64.3 dB (which corresponds to a value of 3.72×10⁻⁷), an increase in the RF coupling efficiency by more than a factor of three, a significant improvement in the RF coupling efficiency.

Figure 5:
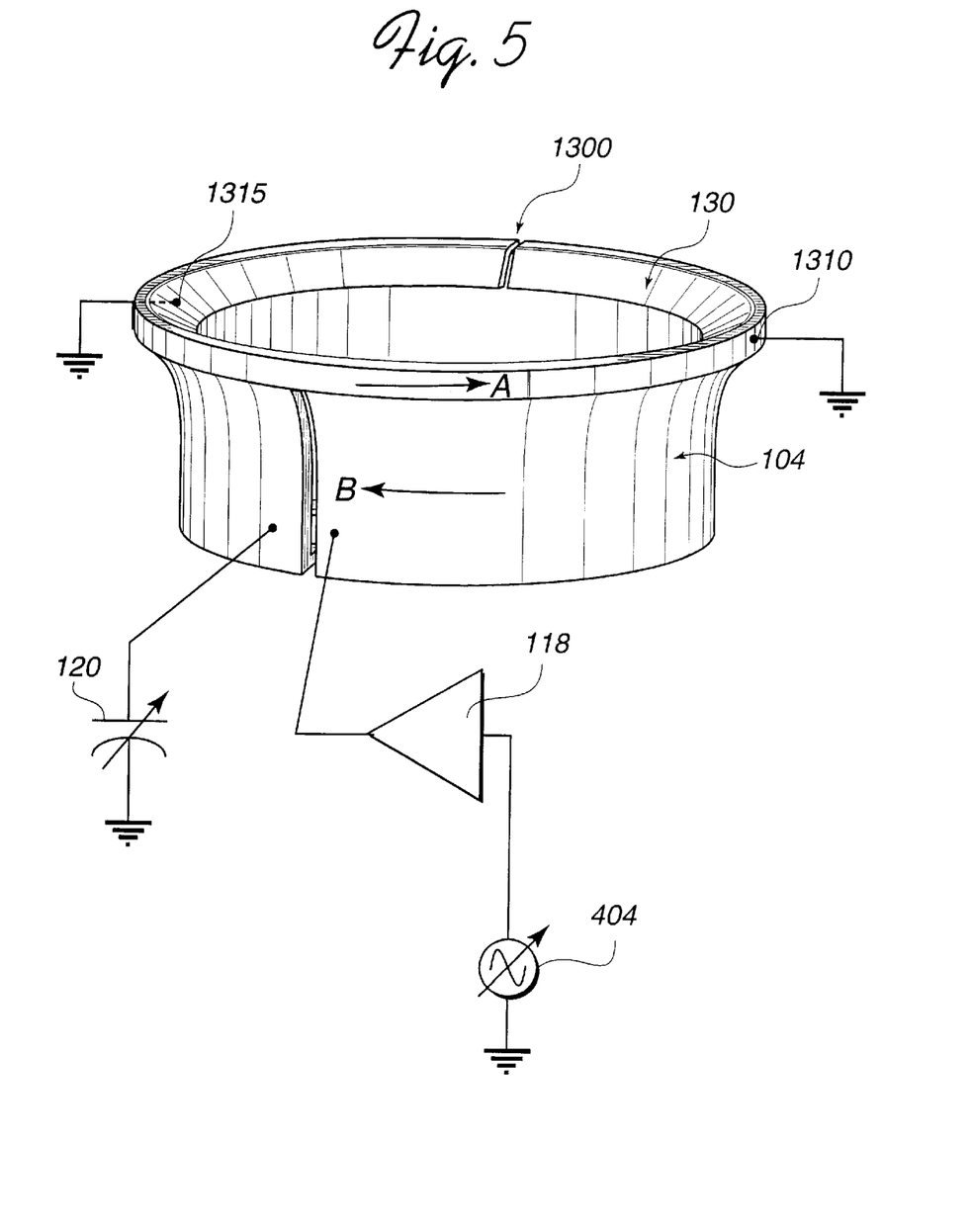
FIG. 5 is a schematic perspective view of another embodiment of a slotted darkspace shield and a powered coil-shield.

It has also been found that grounding the slotted darkspace shield 130 at two points 1310 and 1315, as shown in FIG. 5, located substantially diametrically opposite each other, with each of the two points 1310 and 1315 being about 90° from the slot 1300, results in a degradation of the transmission ratio $S_{12}$ by about −0.5 dB (which corresponds to a reduction by a factor of only 0.9) relative to the grounding of the slotted darkspace shield 130 at one point 1305, as shown in FIG. 4, located substantially diametrically opposite the slot 1300. A slotted darkspace shield 130 grounded at two points 1310 and 1315, as shown in FIG. 5, may result in greater mechanical stability of the slotted darkspace shield than a slotted darkspace shield 130 grounded at one point 1305, as shown in FIG. 4, by being held at two points rather that at one point, and may give a transmission ratio $S_{12}$ of −64.8 dB (which corresponds to a value of 3.31×10⁻⁷), still a significant improvement in the RF coupling efficiency (by a factor of about 3) as compared to an unslotted darkspace shield. The slight degradation of the transmission ratio $S_{12}$ is believed to result from transient eddy currents (indicated by arrow A in FIG. 5) generated in the connected portion of the slotted darkspace shield 130 between the two grounding points 1310 and 1315 by the transient RF currents (indicated by arrow B in FIG. 5) generated in the RF powered chamber shield 106.

The coil-shield 104, like the coil-shield described in the aforementioned copending application Ser. No. 08/559,345, filed Nov. 15, 1995 (Attorney Docket #938/PVD/DV), entitled "Method and Apparatus for Generating a Plasma," by Ivo Raaijmakers, Bradley Stimson and John Forster, which is assigned to the assignee of the present application and is incorporated herein by reference in its entirety, protects the vacuum chamber walls 107 (FIG. 3) from the material being deposited. However, as described in the aforementioned application, the coil-shield 104 has a slotted design which permits the coil-shield 104 to function as a single turn coil.

In the illustrated embodiment, the coil-shield 104 is made of a conductive material which is preferably the same type of material as the material being deposited. Thus, if the target 110 is made of titanium for deposition onto the substrate 112, the coil-shield is preferably made of titanium also such as heavy-duty, bead-blasted solid high-purity (preferably 99.995% pure) titanium formed into a generally cylindrical shape having a diameter of 10–12 inches (25–30 cm). However, other highly conductive materials may be utilized depending upon the material being sputtered and other factors. For example, if the material to be sputtered is aluminum, both the target and the coil-shield 104 may be made of high purity aluminum.

To enable the coil-shield 104 to function as a single turn coil, a thin channel 122 (preferably ¼ to ⅛ inches, or 6 to 3 mm, in width) cut completely through the wall of the shield 104 is formed in a vertical slotted shape. The overall shape of the coil-shield 104 of the illustrated embodiment is generally cylindrical but other shapes may be used depending upon the application.

The coil-shield 104 is carried on the outer shield 106 by a plurality of coil-shield standoffs 124 (FIG. 3) which electrically insulate the coil-shield 104 from the supporting shield 106. As set forth in greater detail, with respect to coil standoffs, in copending application Ser. No. 08/647,182, entitled "Recessed Coil for Generating a Plasma," filed May 9, 1996, now abandoned, (Attorney Docket #1186/PVD/DV) and assigned to the assignee of the present application, which application is incorporated herein by reference in its entirety, the insulating coil-shield standoffs 124 have an internal labyrinth structure which permits repeated deposition of conductive materials from the target 110 onto the coil-shield standoff 124 while preventing the formation of a complete conducting path of deposited material from the inner coil-shield 104 to the outer shield 106 which could short the coil-shield 104 to the shield 106 (which is typically at ground).

RF power is applied to the coil-shield 104 by feedthroughs 126 which are supported by insulating feedthrough standoffs 128. As represented in FIG. 2, the feedthroughs 126 are preferably positioned at the ends 127 of the coil-shield 104. The feedthrough standoffs 128, like the coil-shield standoffs 124, permit repeated deposition of conductive material from the target onto the feedthrough standoff 128 without the formation of a conducting path which could short the coil-shield 104 to the shield 106. Thus, the coil-shield feedthrough standoff 128 has an internal labyrinth structure somewhat similar to that of the coil-shield standoff 124 to prevent the formation of a short between the coil-shield 104 and the wall 140 of the outer shield 106.

Since the width of the channel 122 is relatively small as represented by the gap between the ends 127 of the coil-shield 104, only a relatively small amount of deposition material reaches the outer shield 106. Because less material is deposited on the standoffs, it is anticipated that the design of the standoffs might be substantially simplified over the relatively complex labyrinth designs depicted in FIG. 3. For example, the labyrinth structure may have fewer channels.

If the support standoffs 124 are positioned away from the gap 122 so as to reduce or eliminate the likelihood of deposition material from reaching the standoffs, such remote standoffs could be even further simplified. For example, the standoffs could be formed as a simple post made of an insulative material such as a ceramic.

Because the coil-shield 104 of the illustrated embodiment has only a single vertical slot 122 and the darkspace shield 130 has only a single slot 1300, it is anticipated that the outer shield 106 could be substantially reduced in size. The shield 106 could be formed as segment walls with one segment behind the slot 122 and another segment behind shield slot 1300 rather than encircling the entire coil-shield 104. However, if the coil-shield 104 is a multi-turn coil having a slot which circumscribes the coil-shield as described in copending application Ser. No. 08/730,722, filed Oct. 8, 1996 (Atty. Docket #1207/PVD/DV), a full outer shield 106 may be used.

In an alternative embodiment, an insulating member may be attached to the shield 130 at a position in or behind the shield slot 1300 as described in greater detail in copending application Ser. No. 08/846,423 filed May 14, 1997, entitled "Powered Shield Source for High Density Plasma" (Atty. Docket #1621/PVD/DV) incorporated by reference in its entirety. In a similar fashion, an insulating member may be disposed in the slot 122 of the coil-shield 104. The insulating member confines the plasma and sputtered material and eliminates the need for a separate outer shield such as the shield 106.

The chamber shield 106 is generally bowl-shaped (FIG. 3) and includes a generally cylindrically shaped, vertically oriented wall 140 to which the standoffs 124 and 128 are attached to insulatively support the coil-shield 104. The shield further has a generally annular-shaped floor wall 142 which surrounds the chuck or pedestal 114 which supports the workpiece 112 which has an 8" (20 cm) diameter in the illustrated embodiment. A clamp ring 154 may be used to clamp the wafer to the chuck 114 and cover the gap between the floor wall of the shield 106 and the chuck 114.

The deposition system 100 is supported by an adapter ring assembly 152 which engages an upper annular flange 150 of the vacuum chamber wall 107. The outer shield 106 is grounded to the system ground through the adapter ring assembly 152. The slotted darkspace shield 130, like the outer shield 106, is grounded through the adapter ring assembly 152.

The slotted darkspace shield 130 also has an upper flange 170 which is fastened to the horizontal flange 162 of the adapter ring assembly 152. The slotted darkspace shield 130, like the chamber shield 106, is grounded through the adapter ring assembly 152. Alternatively, the slotted darkspace shield 130 may be carried by an insulating adapter ring assembly 152, which may be made of a variety of insulative materials including ceramics, and grounded at one point 1305 (FIG. 4) opposite the slot 1300, or at two points 1310 and 1315 (FIG. 5) located substantially diametrically opposite each other, with each of the two points 1310 and 1315 being about 90° from the slot 1300.

The target 110 is generally disk-shaped and is also supported by the adapter ring assembly 152. However, the target 110 is negatively biased and therefore should be insulated from the adapter ring assembly 152 which is grounded. Accordingly, seated in a circular channel 176 formed in the underside of the target 110 is a ceramic insulation ring assembly 172 which is also seated in a corresponding channel 174 in the upper side of the adapter ring assembly 152. The insulator ring assembly 172 which may be made of a variety of insulative materials including ceramics spaces the target 110 from the adapter ring assembly 152 so that the target 110 may be adequately negatively biased. The target, adapter and ceramic ring assembly are provided with O-ring sealing surfaces 178 to provide a vacuum tight assembly from the vacuum chamber 102 to the target 110.

To promote uniform erosion of the target 110, a magnetron 116 (FIG. 2) may be provided above the target 110. However, the magnetron may be omitted by increasing the RF ionization of the plasma.

Each of the embodiments discussed above utilized a single coil in the plasma chamber. It should be recognized that the present invention is applicable to plasma chambers having more than one RF powered coil. For example, the present invention may be applied to multiple coil chambers for launching helicon waves of the type described in copending application Ser. No. 08/559,345, "Method and Apparatus for Generating a Plasma."

The appropriate RF generators and matching circuits are components well known to those skilled in the art. For example, an RF generator such as the ENI Genesis series which has the capability to "frequency hunt" for the best frequency match with the matching circuit and antenna is suitable. The frequency of the generator for generating the RF power to the coil-shield 104 is preferably 2 MHz but it is anticipated that the range can vary from, for example, 1 MHz to 100 MHz. An RF power setting of 4.5 kW is preferred but a range of 1.5–5 kW is believed to be satisfactory. In some applications, energy may also be transferred to the plasma by applying AC or DC power to coils and other energy transfer members. A DC power setting for biasing the target 110 of 3 kW is preferred but a range of 2–5 kW and a pedestal bias voltage of −30 volts DC is believed to be satisfactory for many applications.

In the illustrated embodiment, the outer shield 106 has a diameter of 13½" (34 cm) but it is anticipated that good results can be obtained so long as the shield has a diameter sufficient to extend beyond the outer diameter of the target, the substrate support and substrate, to shield the chamber from the plasma. The outer shield 106 may be fabricated from a variety of materials including insulative materials such as ceramics or quartz. However, the shield and all metal surfaces likely to be coated with the target material are preferably made of the same material as the sputtered target material but may be made of a material such as stainless steel or copper. The material of the structure which will be coated should have a coefficient of thermal expansion which closely matches that of the material being sputtered to reduce flaking of sputtered material from the shield or other structure onto the wafer. In addition, the material to be coated should have good adhesion to the sputtered material. Thus for example if the deposited material is titanium, the preferred metal of the shields, brackets and other structures likely to be coated is bead-blasted titanium. Any surfaces which are likely to sputter would preferably be made of the same type of material as the target such as high purity titanium, for example. Of course, if the material to be deposited is a material other than titanium, the preferred metal is the deposited material, stainless steel or copper. Adherence can also be improved by coating the structures with molybdenum prior to sputtering the target. However, it is preferred that the coil (or any other surface likely to sputter) not be coated with molybdenum or other materials since the molybdenum can contaminate the workpiece if sputtered from the coil.

The wafer-to-target spacing is preferably about 140 mm but can range from about 1.5" to 8" (4 cm to 20 cm). For this wafer-to-target spacing, a coil diameter of about 11½ inches (29 cm) is preferred. Increasing the diameter of the coil which moves the coil away from the workpiece edge can have an adverse effect on bottom coverage. On the other hand, decreasing the coil diameter to move the coil closer to the wafer edge can adversely affect layer uniformity. It is believed that decreasing the coil diameter will cause the coil to be more closely aligned with the target resulting in substantial deposition of material from the target onto the coil which in turn can adversely affect the uniformity of material being sputtered from the coil.

A variety of sputter gases may be utilized to generate the plasma including Ar and various reactive gases such as $H_2$, $NF_3$, $CF_4$ and others may be used. Various precursor gas pressures are suitable including pressures of 0.1–50 mTorr. For ionized PVD, a pressure between 10 and 50 mTorr provides suitable ionization of sputtered material.

It will, of course, be understood that modifications of the present invention, in its various aspects, will be apparent to those skilled in the art, some being apparent only after study others being matters of routine mechanical and electronic design. Other embodiments are also possible, their specific designs depending upon the particular application. As such, the scope of the invention should not be limited by the particular embodiments herein described but should be defined only by the appended claims and equivalents thereof.

What is claimed is:

1. An apparatus for energizing a plasma within a semiconductor fabrication system to sputter material from a target onto a substrate, the apparatus comprising:

an RF signal source;

a semiconductor fabrication chamber having a wall, a conductive darkspace shield positioned adjacent said target to shield a periphery of said target, and a plasma generation region adjacent to said target; and a coil-shield positioned within the chamber to protect at least a portion of the chamber wall from deposition materials, said coil-shield having a slot which defines first and second ends wherein one of said coil-shield ends is electrically coupled to said RF signal source and the other of said coil-shield ends is coupled to ground, said coil-shield being positioned to couple RF energy into said plasma generation region, to produce ions to ionize sputtered material, wherein said darkspace shield has a discontinuity of sufficient size to substantially reduce eddy currents from flowing in said darkspace shield in response to said RF energy coupled into said plasma generation region.

2. An apparatus for use with an RF signal source, for energizing a plasma within a semiconductor fabrication system to sputter material onto a substrate, the apparatus comprising:

a semiconductor fabrication chamber having a wall, a target, a conductive darkspace shield positioned adjacent said target to shield periphery of said target, and a plasma generation region adjacent to said target and to said darkspace shield; and a coil-shield positioned within the chamber to protect at least a portion of the chamber wall from deposition materials, said coil-shield having a slot which defines first and second ends wherein one of said coil-shield ends is electrically coupled to said RF signals source and the other of said coil-shield ends is coupled to ground, said coil-shield being positioned adjacent said darkspace shield to couple RF energy into said plasma generation region, to produce ions sputtered material, wherein said darkspace shield defines a slot to substantially reduce eddy currents from flowing in said slotted darkspace shield in response to said RF energy coupled into said plasma generation region.

3. The apparatus of claim 2 wherein said slotted darkspace shield is grounded at a plurality of points spaced along said darkspace shield.

4. The apparatus of claim 2 wherein the darkspace shield is frusto-conically shaped.

5. The apparatus of claim 2 wherein said darkspace is ring-shaped.

6. The apparatus of claim 2 wherein said darkspace shield slot defines two separated ends.

7. The apparatus of claim 2 wherein said darkspace shield is spaced from but overlaps said coil-shield.

8. The apparatus of claim 2 wherein said eddy currents are azimuthal.

9. The apparatus of claim 2 wherein said darkspace shield is grounded.

10. The apparatus of claim 9 wherein said darkspace shield provides a ground plane for said target periphery.

11. The apparatus of claim 9 wherein said darkspace shield defines a diameter and is grounded at a point on said darkspace shield diametrically opposite said darkspace shield slot.

12. The apparatus of claim 9 wherein said darkspace shield defines a diameter and is grounded at a pair of points on said darkspace shield diametrically opposite each other.

13. The apparatus of claim 12 wherein said darkspace shield grounded points are each positioned approximately 90 degrees from said darkspace shield slot.

14. The apparatus of claim 2 wherein said chamber defines a vertical axis between said target and said substrate and said darkspace shield slot is oriented axially with respect to said vertical axis.

15. The apparatus of claim 2 wherein said coil-shield has a plurality of windings between said first and second coil-shield ends.

16. A method of depositing material on a substrate in a semiconductor processing chamber having a wall, the method comprising coupling RF energy from a coil-shield into a plasma to produce ions to ionize material sputtered from a target, said coil-shield having first and second terminals wherein one of said coil-shield terminals is electrically coupled to an RF signal source and the other terminal of said coil-shield is coupled to ground, and wherein said coil-shield is positioned within said chamber to protect at least a portion of said chamber wall from deposition materials; and reducing eddy current RF energy losses by providing a slotted darkspace shield positioned adjacent a target to shield a periphery of said target adjacent said plasma.

17. The method of claim 16 wherein said darkspace shield is ring-shaped.

18. The method of claim 16 wherein said darkspace shield slot defines two separate ends.

19. The method of claim 16 wherein said darkspace shield is spaced from but overlaps said coil-shield.

20. The method of claim 16 wherein said eddy currents are azimuthal.

21. The method of claim 16 wherein said darkspace is grounded.

22. The method of claim 21 wherein said darkspace shield provides a ground plane for said target periphery.

23. The method of claim 21 wherein said darkspace shield defines a diameter and is grounded at a point on said darkspace shield diametrically opposite said darkspace shield slot.

24. The method of claim 21 wherein said darkspace shield defines a diameter and is grounded at a pair of points on said darkspace shield diametrically opposite each other.

25. The method of claim 24 wherein said darkspace shield grounded points are positioned approximately 90 degrees from said darkspace shield slot.

26. The method of claim 16 wherein said chamber defines a vertical axis between said target and substrate and said darkspace shield slot is oriented axially with respect to said vertical axis.

27. The method of claim 16 wherein said coil-shield has a plurality of windings between said first and second terminals.

28. An apparatus for use with an RF signal source, for energizing a plasma within a semiconductor fabrication system to sputter material onto a substrate, the apparatus comprising:

a semiconductor fabrication chamber having a wall, a target and a plasma generation region adjacent to said target;

a coil-shield carried by said chamber and positioned within the chamber to protect at least a portion of the chamber wall from deposition materials and to couple RF energy into said plasma generation region, to produce ions to ionize sputtered material, said coil-shield having a slot which defines first and second ends wherein one of said coil-shield ends is electrically coupled to said RF signal source and the other of said coil-shield ends is coupled to ground; and a conductive darkspace shield positioned between said target and said coil-shield to shield a periphery of said target, said darkspace shield being positioned adjacent said coil-shield and having slot means for reducing eddy currents from flowing in said darkspace shield in response to said RF energy coupled into said plasma generation region.

\* \* \* \* \*